United States Patent
Ogawa

(10) Patent No.: US 7,702,992 B2
(45) Date of Patent: Apr. 20, 2010

(54) SEMICONDUCTOR INTEGRATED CIRCUIT WITH FLIP-FLOPS HAVING INCREASED RELIABILITY

(75) Inventor: Toshio Ogawa, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 916 days.

(21) Appl. No.: 11/505,447

(22) Filed: Aug. 17, 2006

(65) Prior Publication Data

US 2007/0226600 A1 Sep. 27, 2007

(30) Foreign Application Priority Data

Mar. 17, 2006 (JP) .............................. 2006-075003

(51) Int. Cl.
*G06F 11/00* (2006.01)
(52) U.S. Cl. .................. 714/798; 714/797; 714/726; 714/727
(58) Field of Classification Search .......... 714/726, 714/727, 797, 798
See application file for complete search history.

(56) References Cited

U.S. PATENT DOCUMENTS

| 7,451,370 | B2* | 11/2008 | Whetsel ...................... 714/727 |
| 2002/0124218 | A1* | 9/2002 | Kishimoto ................. 714/738 |
| 2004/0163018 | A1* | 8/2004 | Yoshida ....................... 714/48 |
| 2004/0183581 | A1* | 9/2004 | Yasui et al. ................. 327/215 |
| 2005/0278588 | A1* | 12/2005 | Cohn et al. .................... 714/51 |
| 2006/0242541 | A1* | 10/2006 | Gower et al. ............... 714/767 |

FOREIGN PATENT DOCUMENTS

JP    2002-251898 A    9/2002

* cited by examiner

*Primary Examiner*—Guy J Lamarre
(74) *Attorney, Agent, or Firm*—Arent Fox LLP

(57) ABSTRACT

A semiconductor integrated circuit includes a plurality of flip-flop sets, and a logic circuit configured to consolidate error-detection signals output from the flip-flop sets into one output signal, wherein each of the flip-flop sets includes one or more flip-flops configured to latch input data in synchronization with a common clock signal, and an error detection-&-correction circuit configured to detect and correct an error in data stored in the flip-flops, and to produce one of the error-detection signals indicative of the detection of the error upon the detection of the error.

9 Claims, 6 Drawing Sheets

SEMICONDUCTOR INTEGRATED CIRCUIT WITH FLIP-FLOPS HAVING INCREASED RELIABILITY

CROSS-REFERENCE TO RELATED APPLICATIONS

The present application is based upon and claims the benefit of priority from the prior Japanese Patent Application No. 2006-075003 filed on Mar. 17, 2006, with the Japanese Patent Office, the entire contents of which are incorporated herein by reference.

BACKGROUND OF THE INVENTION

1. Field of the Invention

The present invention generally relates to semiconductor integrated circuits, and particularly relates to a semiconductor integrated circuit having an error correction function.

2. Description of the Related Art

During the days in which semiconductor technologies were not yet matured, the reliability of flip-flops inside semiconductor circuits were low, resulting in the destruction of data stored in the flip-flops in some cases. The reason why such data destruction occurred may be attributable to the low reliability of circuit operations, or may be attributable to radiation emitted from a metal contained in semiconductor packages. Since the possibility of data destruction in flip-flops was small, a countermeasure was taken by performing a parity check on the data of flip-flops so as to suspend the system upon error detection, for example.

At the present day, the problem of having the data stored in flip-flops being destroyed is no longer in existence due to the development of semiconductor technology. Even with the semiconductor integrated circuits manufactured by use of the state-of-the-art semiconductor technology, however, the existence of the phenomenon called "soft error" is known in the case of DRAM, for example. This phenomenon is attributable to high-energy neutrons resulting from cosmic rays (i.e., neutrons as secondary particles generated upon reaction between positrons included in the cosmic rays and atomic nucleus contained in the atmosphere). In this phenomenon, bits stored in memory cells are changed by electric charge resulting from ions that are generated by the collisions between high-energy neutrons resulting from cosmic rays and silicon atomic nucleus because the DRAM memory cells consist of minute capacitance. In the case of flip-flops, however, the HIGH/LOW logic state of nodes of a cross-coupling circuit stores data. Unlike the DRAM, thus, data is never inverted by such energy as small as that of neutrons resulting from cosmic rays.

In the future, the size of circuit elements and the width of cross-connects will be further reduced due to the development of semiconductor technology. As such progress is made, it is expected that flip-flops used in semiconductor integrated circuits may suffer data destruction due to high-energy neutrons resulting from cosmic rays. In this case, the frequency of such data destruction is expected to be relatively high, so that a countermeasure that suspends a system upon error detection will not be suitable.

[Patent Document 1] Japanese Patent Application Publication No. 2002-251898

Accordingly, there is a need for a semiconductor integrated circuit with flip-flops providing an increased data reliability.

SUMMARY OF THE INVENTION

It is a general object of the present invention to provide a semiconductor integrated circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor integrated circuit particularly pointed out in the specification in such full, clear, concise, and exact terms as to enable a person having ordinary skill in the art to practice the invention.

To achieve these and other advantages in accordance with the purpose of the invention, the invention provides a semiconductor integrated circuit which includes a plurality of flip-flop sets, and a logic circuit configured to consolidate error-detection signals output from the flip-flop sets into one output signal, wherein each of the flip-flop sets includes one or more flip-flops configured to latch input data in synchronization with a common clock signal, and an error detection-&-correction circuit configured to detect and correct an error in data stored in the flip-flops, and to produce one of the error-detection signals indicative of the detection of the error upon the detection of the error.

According to at least one embodiment of the present invention, an error detection-&-correction circuit is provided in each flip-flop set of the semiconductor integrated circuit to detect and correct an error occurring in the stored data, thereby improving the reliability of flip-flop data. Further, error-detection signals output from the flip-flop sets are consolidated into one signal, so that a controller internally provided or an apparatus separate from the semiconductor integrated circuit may be used to check the consolidated error-detection signal so as to detect the occurrence of error.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1:
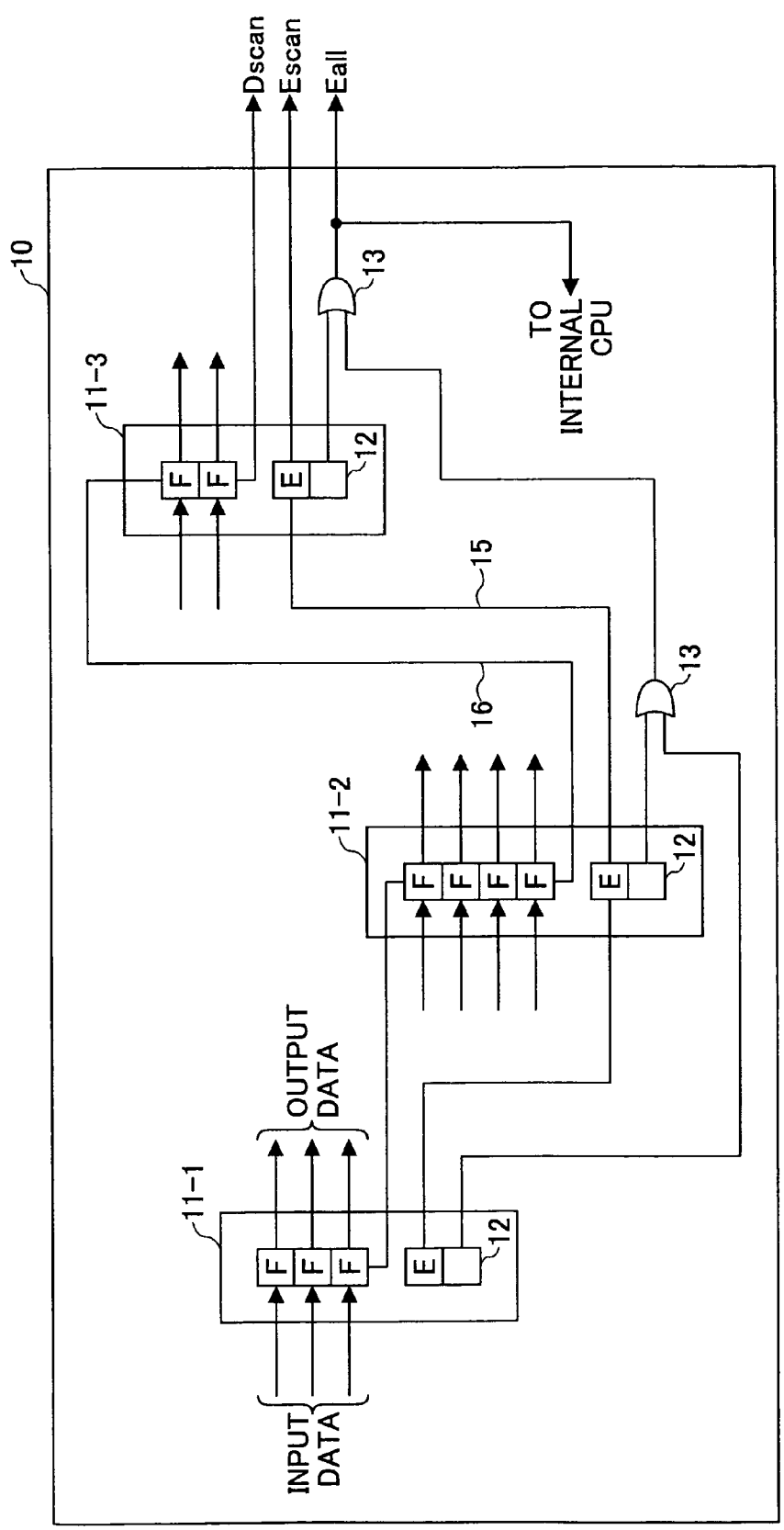
FIG. 1 is a drawing showing an example of the configuration of a semiconductor integrated circuit according to the present invention.

FIG. 1 is a drawing showing an example of the configuration of a semiconductor integrated circuit according to the present invention. A semiconductor integrated circuit 10 shown in FIG. 1 includes flip-flop sets 11-1 through 11-3 and a plurality of OR gates 13.

The flip-flops of the flip-flop sets 11-1 through 11-3 are all the flip-flops that receive, latch, and output various signals such as data signals, control signals, clock signals, etc., for use in the operations of the semiconductor integrated circuit 10. Although not illustrated, the semiconductor integrated circuit 10 includes various circuits that are connected to these flip-flop sets 11-1 through 11-3. Namely, all the flip-flops provided in the semiconductor integrated circuit 10 are shown as the flip-flop sets 11-1 through 11-3. Among these flip-flops, the flip-flops that are adjacently arranged to store data at the same timing in response to the same clock signal are grouped together to form one flip-flop set. The number of flip-flops included in one flip-flop set may be one or more. For the sake of convenience of illustration, only three flip-flop sets are shown here. In reality, however, tens of thousands or hundreds of thousands of such flip-flop sets may be in existence in a semiconductor integrated circuit, depending on the circuit scale.

Each of the flip-flop sets 11-1 through 11-3 includes one or more data-purpose flip-flops F, an error-detection-purpose flip-flop E, and an error-detection-and-correction circuit 12. The data-purpose flip-flops F latch input data, and output the latched data. The error-detection-and-correction circuit 12 detects and corrects an error included in the data stored in the flip-flops F by using ECC (error correcting codes), parity check, majority-voting logic, etc., as will later be described. If an error is detected in the data stored in the flip-flops F, the error-detection-and-correction circuit 12 asserts its output that is an error detection signal (which is set to the HIGH-level output state for assertion in this example). The error detection signals output from the error-detection-and-correction circuits 12 of the flip-flop sets 11-1 through 11-3 are subjected to logical sum performed by the OR gates 13 so as to be consolidated into an error detection signal Eall, which is provided to the exterior of the semiconductor integrated circuit 10.

The consolidated error detection signal Eall may as well be supplied to a controller such as a CPU provided inside the semiconductor integrated circuit 10. The error detection signal Eall may include two bits, one being a first error detection signal indicative of the presence of a correctable error and the other being a second error detection signal indicative of the presence of an uncorrectable error. The provision may be made such that the logical sum described above is performed separately for each of these two bits. Further, the error detection signal Eall does not have to be made by consolidating all the error detection signals from all the flip-flop sets 11-1 through 11-3. For example, all the flip-flop sets may be divided into a first group and a second group, and a consolidated error detection signal may be output separately for each of these groups.

The assertion of the consolidated error detection signal Eall indicates the occurrence of error in any one or more of the flip-flops provided in the semiconductor integrated circuit 10. In order to check which one of the flip-flop sets 11-1 through 11-3 suffers an error, the error-detection-purpose flip-flop E is used.

The error-detection-purpose flip-flop E has "1" stored therein by the error-detection-and-correction circuit 12 upon the detection of error by the error-detection-and-correction circuit 12. The error-detection-purpose flip-flops E of the flip-flop sets 11-1 through 11-3 are connected in series such that the output of a given flip-flop is input into the flip-flop at the next stage, thereby forming a flip-flop chain 15. When the consolidated error detection signal Eall is asserted, the data of the flip-flops of the chain 15 are successively shifted to the next following stages, so that the contents of the error-detection-purpose flip-flops E are supplied to the exterior of the semiconductor integrated circuit 10 as an error scan signal Escan. From outside the semiconductor integrated circuit 10, the position of the error can be located based on the contents of the error scan signal Escan that is read out from the semiconductor integrated circuit 10.

By the same token, the data-purpose flip-flops F of the flip-flop sets 11-1 through 11-3 may be configured to form a chain. Namely, the data-purpose flip-flops F may be connected in series such that the output of a given flip-flop is input into the flip-flop at the next stage, thereby forming a flip-flop chain 16. When the consolidated error detection signal Eall is asserted, the data of the flip-flops of the chain 16 are successively shifted to the next following stages, so that the contents of the data-purpose flip-flops F are supplied to the exterior of the semiconductor integrated circuit 10 as a data scan signal Dscan. From outside the semiconductor integrated circuit 10, detailed analysis such as the locating of an error bit position can be performed based on the contents of the data scan signal Dscan that is read out from the semiconductor integrated circuit 10.

The data-purpose flip-flops F have data-input/output paths used for the purpose of providing their intended functions as part of the operation of the semiconductor integrated circuit 10, so that the chain 16 needs to be provided as a path separate from those paths. As is known as a technology for scan-chain configuration, a selector may be provided in front of the input of each flip-flop so as to select one of the intended input of the flip-flop and the output of the preceding flip-flop in the chain. Provision may be made such that the intended input of the flip-flop is selected during the routine operation, and such that the output of the preceding flip-flop in the chain is selected during the scan operation. Alternatively, a flip-flop that has two input nodes, one for receiving routine data and the other for receiving scan input, may be used. Alternatively, flip-flops separate from the original flip-flops may be provided as shadow registers in a duplicate manner, such that the original flip-flops are used to serve the intended purpose of the semiconductor integrated circuit, and such that the duplicated flip-flops are used for the scan operation. In this configuration, a scan operation can be performed while performing the routine operation of the semiconductor integrated circuit 10.

Figure 2:
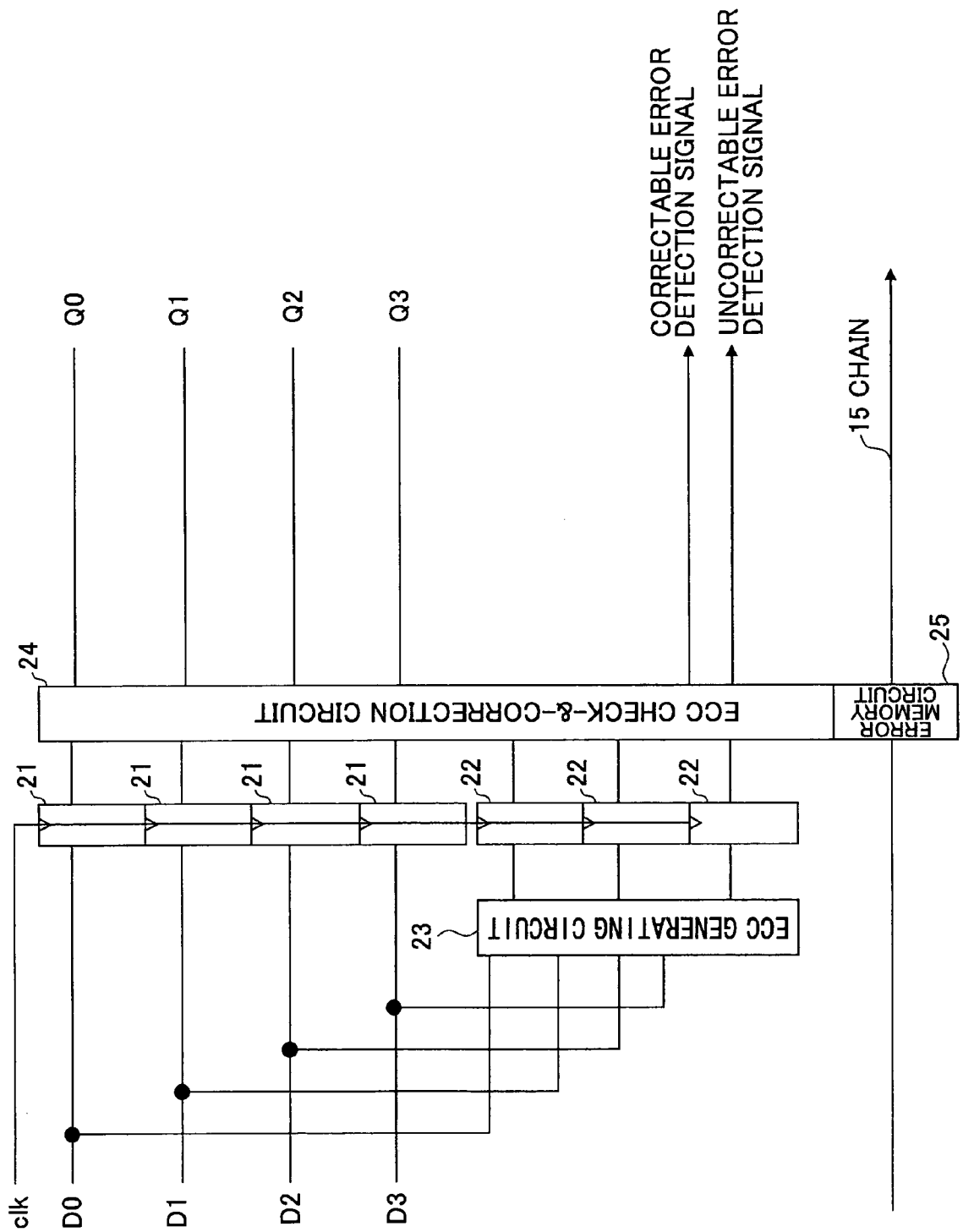
FIG. 2 is a drawing showing an example of the configuration of a flip-flop set according to a first embodiment of the present invention.

FIG. 2 is a drawing showing an example of the configuration of a flip-flop set according to a first embodiment of the present invention. The flip-flop set shown in FIG. 2 is one of the flip-flop sets 11-1 through 11-3, and corresponds to an example in which the ECC is used for error correction and detection.

The flip-flop set shown in FIG. 2 includes a plurality of data-purpose flip-flops 21, a plurality of error-correction-code-purpose flip-flops 22, an ECC generating circuit 23, an ECC check-&-correction circuit 24, and an error memory circuit 25. The data-purpose flip-flops 21 correspond to the data-purpose flip-flops F shown in FIG. 1, and the error memory circuit 25 corresponds to the error-detection-purpose flip-flop E shown in FIG. 1. Further, the error-correction-code-purpose flip-flops 22, the ECC generating circuit 23, and the ECC check-&-correction circuit 24 together correspond to the error-detection-and-correction circuit 12 shown in FIG. 1. For the sake of convenience of illustration, a chain corresponding to the chain 16 shown in FIG. 1 is not illustrated.

The data-purpose flip-flops 21 receive input data D0 through D3, and load (latch) the input data D0 through D3 in synchronization with a clock signal CLK. The stored data (latched data) of the data-purpose flip-flops 21 are supplied to the ECC check-&-correction circuit 24. If there is no error, the stored data of the data-purpose flip-flops 21 are transmitted as output data Q0 through Q3 without any data change.

As the input data D0 through D3 are supplied to the data-purpose flip-flops 21, the ECC generating circuit 23 performs a predetermined computation on the input data D0 through D3 to derive an error correcting code. The derived error correcting code is stored in the error-correction-code-purpose flip-flops 22 in synchronization with the clock signal CLK.

The ECC check-&-correction circuit 24 determines whether there is an error based on the data supplied from the data-purpose flip-flops 21 and the error correcting code supplied from the error-correction-code-purpose flip-flops 22, and performs an error correction if error is present. The error-corrected data is then transmitted as the output data Q0 through Q3. If the Hamming code is used for error correction, for example, error correction is possible if one-bit error occurs, while only error detection is possible if two-bit error occurs.

An example will be examined here in which an error correcting code is generated such that a total of 7 bits comprised of 4 bits of the data-purpose flip-flops 21 and 3 bits of the error-correction-code-purpose flip-flops 22 constitutes a Hamming code for which inter-code distance is three bits or more, for example. In this case, the presence/absence of error can be determined by checking whether the 7-bit output of the flip-flops has a bit pattern that is proper as a Hamming code. If error occurs in 1 bit, a difference between the 7-bit data and the Hamming code having the shortest Hamming distance from this 7-bit data is calculated, so that the 1 erroneous bit can be identified and corrected. Since the inter-code distance of the Hamming code is three, the presence of two-bit error allows only a determination to be made as to the presence/absence of error, but does not allow a determination to be made as to what Hamming code is a correct code. In practice, the syndrome information of the Hamming code may be calculated. The syndrome information uniquely indicates the presence/absence of error and the position of the error.

The ECC check-&-correction circuit 24 supplies to an exterior an error-detection signal indicative of the presence/absence of error upon the determination regarding the presence/absence of error as described above. This error-detection signal corresponds to the error-detection signal shown in FIG. 1, and may include a correctable-error-detection signal indicating the presence of a correctable error and an uncorrectable-error-detection signal indicating the presence of an uncorrectable error. The ECC check-&-correction circuit 24 stores "1" in the error memory circuit 25 upon the detection of error.

According to the first embodiment as described above, the ECC is applied to the flip-flop sets provided in the semiconductor integrated circuit 10, so that error detection and error correction are possible upon the occurrence of a bit error. If the extended Hamming code is used, the correction of multiple failed bits becomes also possible. In this manner, the reliability of flip-flop data in the semiconductor integrated circuit 10 can be improved.

Figure 3:
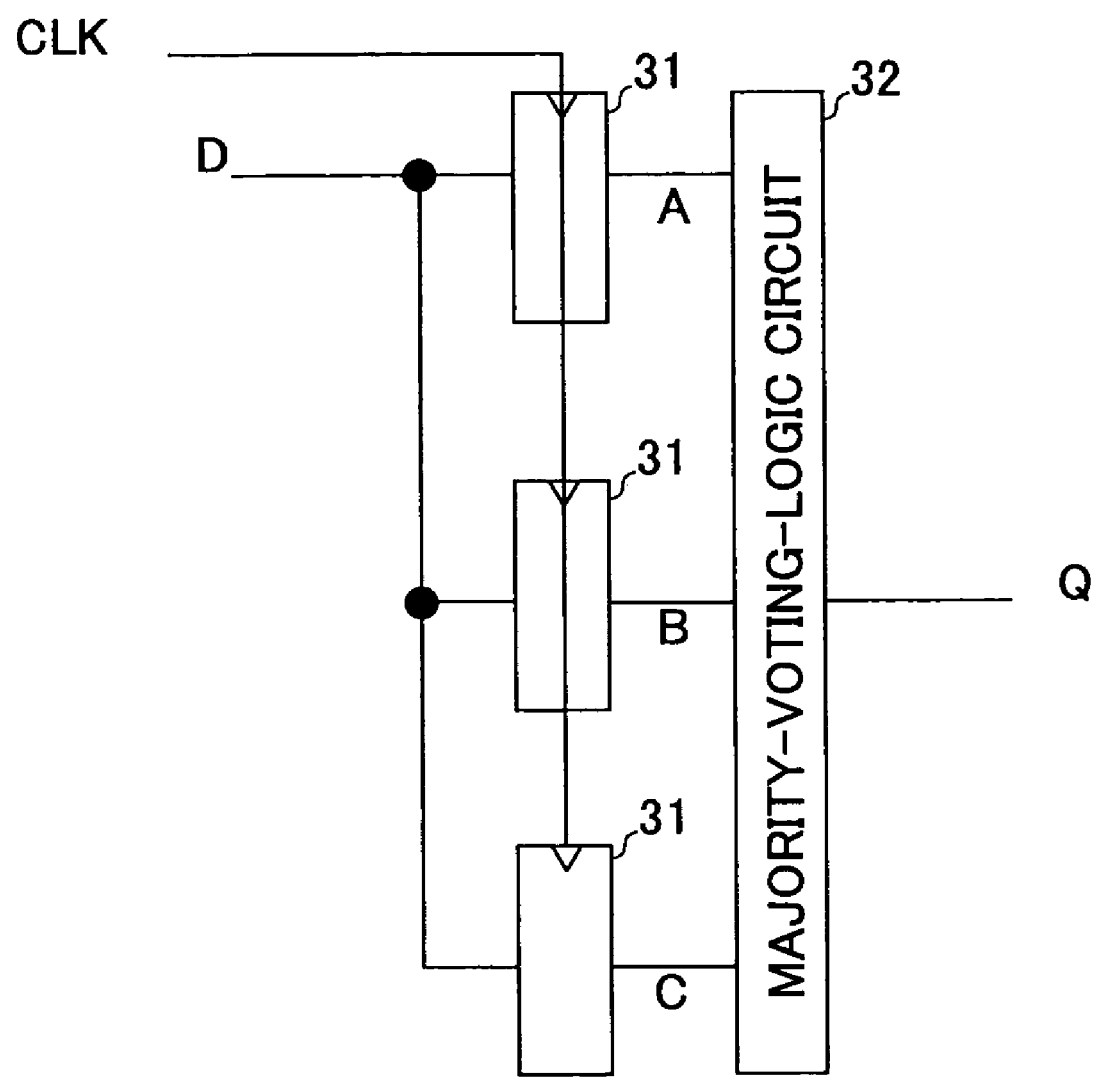
FIG. 3 is a drawing showing an example of the configuration of a data-purpose flip-flop according to a second embodiment of the present invention.

FIG. 3 is a drawing showing an example of the configuration of a data-purpose flip-flop F according to a second embodiment of the present invention. In the first embodiment shown in FIG. 2, an error correcting code is generated from the data input into the data-purpose flip-flops F so as to improve the reliability of flip-flop data. In the second embodiment shown in FIG. 3, a majority voting rule is applied to each data-purpose flip-flop F to improve the reliability of data of each flip-flop.

A data-purpose flip-flop 30 shown in FIG. 3 includes a plurality of latches 31 and a majority-voting-logic circuit 32. Although three latches 31 are illustrated in FIG. 3, the number of latches is not limited to three, and may be any number that is two or more (an odd number is preferable since the majority voting rule is used to determine the logic value).

As input data D is supplied to the data-purpose flip-flop 30, the input data D is supplied to all the latches 31. All the latches 31 load (latch) the same input data in synchronization with the clock signal CLK.

The majority-voting-logic circuit 32 receives outputs A, B, and C from the latches 31, and computes a majority-voting-logic value. Namely, one of the logic value "0" and the logic value "1" that is found in larger number in the outputs A, B, and C is identified, and the majority-voting-logic circuit 32 produces this identified logic value as an output Q. The input data D may be "1", for example. However, due to the effect of secondary cosmic-ray neutrons, data is inverted in one of the three latches 31, so that the output B becomes "0". Even in this case, the number of the logic value "1" accounts for a majority among the outputs A, B, and C, so that the majority-voting-logic circuit 32 can produces the correct data value "1".

Here, the data-purpose flip-flop 30 may be prepared as a library cell for use in the circuit design. Provision of such a library cell makes it possible to place the cell in the same manner as placing a flip-flop, thereby eliminating unnecessary labor during the design process.

Figure 4:
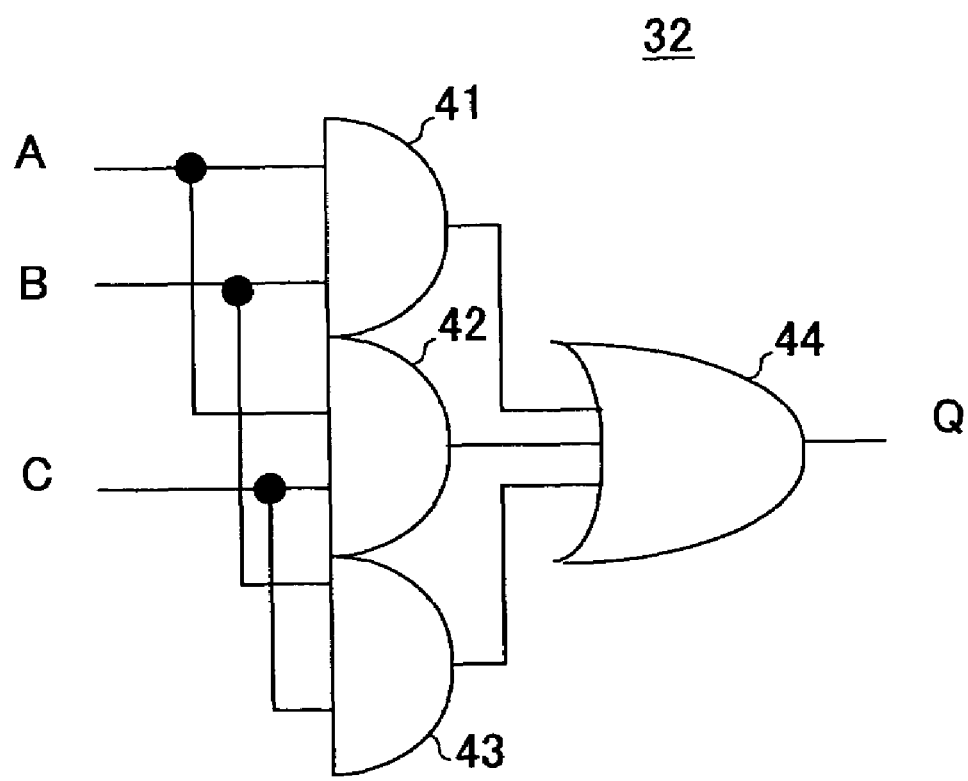
FIG. 4 is a drawing showing an example of the configuration of a majority-voting-logic circuit.

FIG. 4 is a drawing showing an example of the configuration of the majority-voting-logic circuit 32. The majority-voting-logic circuit 32 shown in FIG. 4 includes AND gates 41 through 43 and an OR gate 44. When all of the latch outputs A, B, and C are "1", all the outputs of the AND gates 41 through 43 are "1", so that the output Q of the OR gate 44 is "1". When all of the latch outputs A, B, and C are "0", all the outputs of the AND gates 41 through 43 are "0", so that the output Q of the OR gate 44 is "0". When two of the latch outputs A, B, and C are "1", one of the outputs of the AND gates 41 through 43 is "1", so that the output Q of the OR gate 44 is "1". When two of the latch outputs A, B, and C are "0", all the outputs of the AND gates 41 through 43 are "0", so that the output Q of the OR gate 44 is "0". In this manner, a majority-voting logic is implemented.

When the data-purpose flip-flop 30 is used in the flip-flop sets 11-1 through 11-3 shown in FIG. 1, the error-detection-and-correction circuit 12 may be configured such that the error-detection signal output is asserted when all the outputs of the latches 31 are not the same with respect to any given data-purpose flip-flop 30 shown in FIG. 3, for example. Such logic circuit can easily be implemented by combining XOR (exclusive-OR) gates and an OR gate, for example. In this case, the error detection signal is comprised of one type of an error-detection signal.

According to the second embodiment as described above, a majority-voting rule is applied to each flip-flop provided in the semiconductor integrated circuit 10, so that error detection and error correction are possible upon the occurrence of error. In this manner, the reliability of flip-flop data in the semiconductor integrated circuit 10 can be improved. Since a simple majority voting rule is used, error correction can be performed at faster speed than when the ECC is used. Further, since bit-by-bit error correction is performed, reliability is high.

Figure 5:
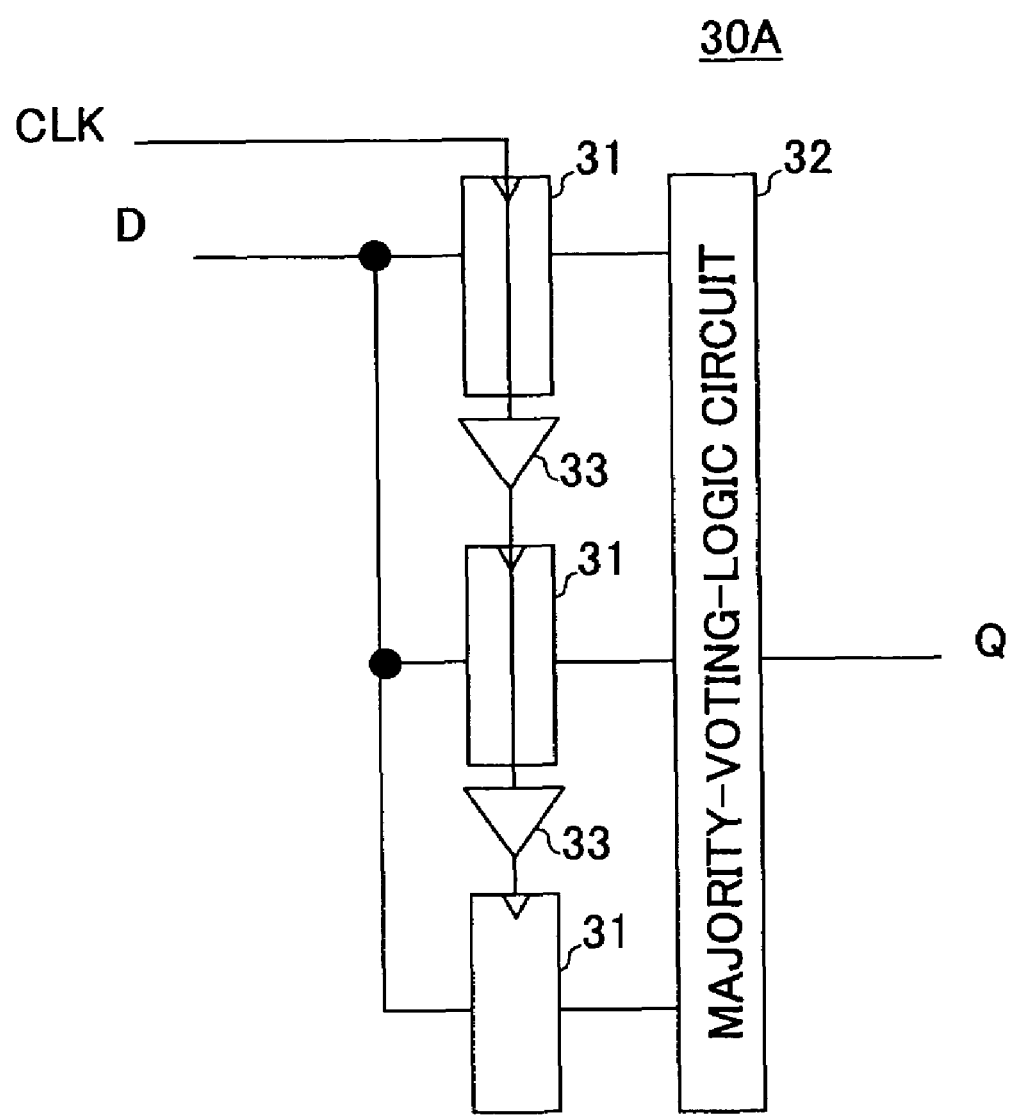
FIG. 5 is a drawing showing a variation of the data-purpose flip-flop shown in FIG. 3.

FIG. 5 is a drawing showing a variation of the data-purpose flip-flop 30 shown in FIG. 3. In FIG. 5, the same elements as those of FIG. 3 are referred to by the same numerals, and a description thereof will be omitted.

A data-purpose flip-flop 30A shown in FIG. 5 includes the plurality of latches 31, a plurality of delay elements 33, and the majority-voting-logic circuit 32. The delay elements 33 serve to delay the clock signal CLK. The clock signals CLK supplied to the individual latches 31 have respective, different timings due to the delays incurred by the delay elements 33.

As input data D is supplied to the data-purpose flip-flop 30A, the input data D is supplied to all the latches 31. All the latches 31 load (latch) the input data in synchronization with the clock signals having respective, different timings. In this case, the load timing (latch timing) varies, so that even if there is a glitch such as a distortion of signal waveform at a rising edge of the input data D, all the data are not affected and incorrectly latched due to the glitch. Accordingly, the use of the majority-voting-logic circuit 32 serves not only to provide a reliable circuit capable of coping with soft errors, but also to provide a circuit capable of coping with errors resulting from a glitch.

Figure 6:
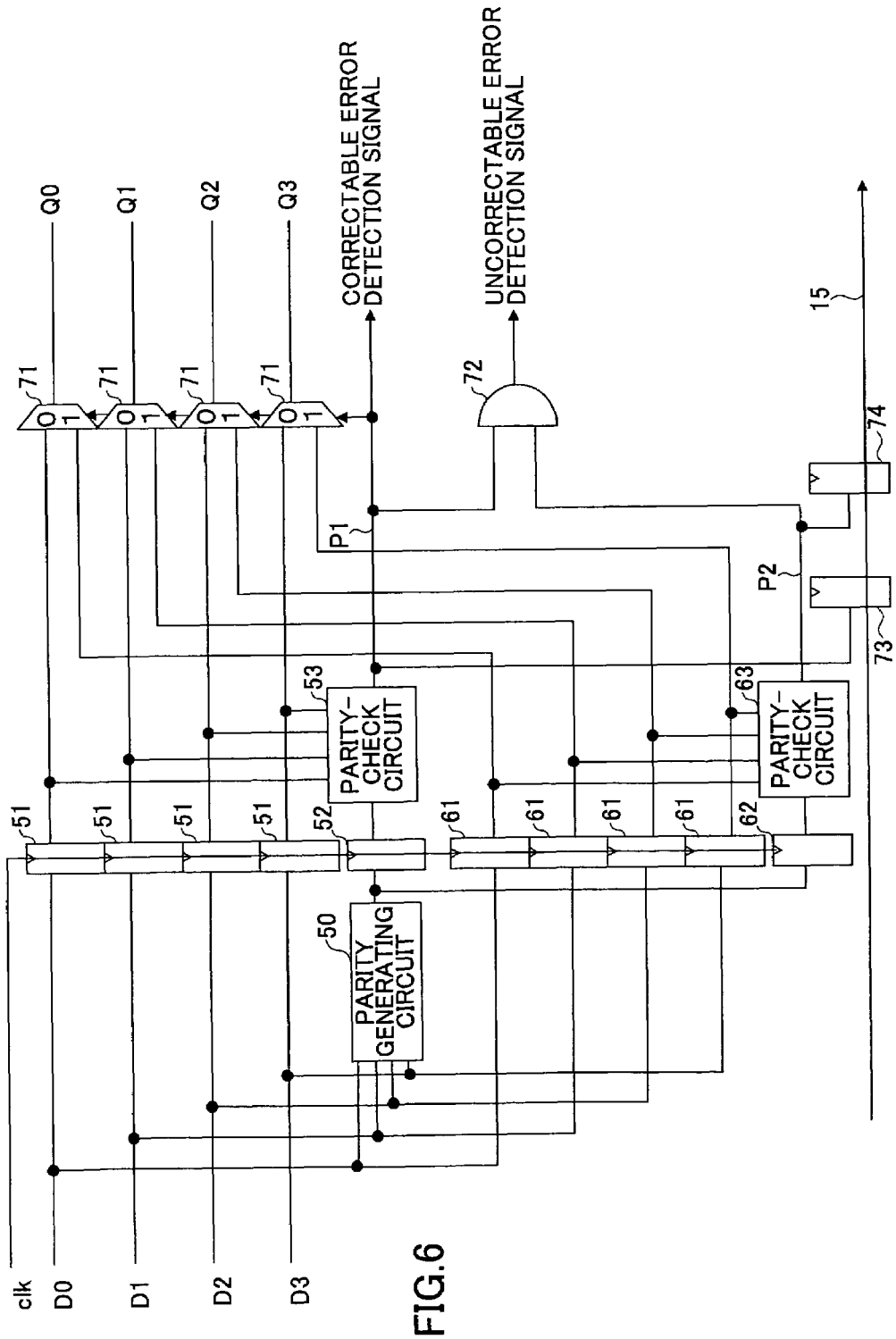
FIG. 6 is a drawing showing an example of the configuration of a flip-flop set according to a third embodiment of the present invention.

FIG. 6 is a drawing showing an example of the configuration of a flip-flop set according to a third embodiment of the present invention. The flip-flop set shown in FIG. 6 is one of the flip-flop sets 11-1 through 11-3, and corresponds to an example in which a parity check is used for error correction and detection.

The flip-flop set shown in FIG. 6 includes a parity generating circuit 50, a plurality of data-purpose flip-flops 51, a parity-bit-purpose flip-flop 52, a parity-check circuit 53, a plurality of data-purpose flip-flops 61, a parity-bit-purpose flip-flop 62, a parity-check circuit 63, a plurality of selectors 71, an AND circuit 72, an error memory circuit 73, and an error memory circuit 74. The data-purpose flip-flops 51 and 61 correspond to the data-purpose flip-flops F shown in FIG. 1, and the error memory circuits 73 and 74 correspond to the error-detection-purpose flip-flop E shown in FIG. 1. Further, the parity generating circuit 50, the parity-bit-purpose flip-flop 52, the parity-check circuit 53, the parity-bit-purpose flip-flop 62, the parity-check circuit 63, the selectors 71, and the AND circuit 72 together correspond to the error-detection-and-correction circuit 12 shown in FIG. 1. For the sake of convenience of illustration, a chain corresponding to the chain 16 shown in. FIG. 1 is not illustrated.

The data-purpose flip-flops 51 and 61 receive input data D0 through D3, and load (latch) the input data D0 through D3 in synchronization with a clock signal CLK. The stored data (latched data) of the data-purpose flip-flops 51 are supplied to the selectors 71, and are also supplied to the parity-check circuit 53. The stored data (latched data) of the data-purpose flip-flops 61 are supplied to the selectors 71, and are also supplied to the parity-check circuit 63.

As the input data D0 through D3 are supplied to the data-purpose flip-flops 51 and 61, the parity generating circuit 50 performs a predetermined computation on the input data D0 through D3 to derive a parity bit. The derived parity bit is stored in the parity-bit-purpose flip-flops 52 and 62 in synchronization with the clock signal CLK.

The parity-check circuit 53 determines whether there is an error by performing a parity check based on the data supplied from the data-purpose flip-flops 51 and the parity bit supplied from the parity-bit-purpose flip-flop 52. If there is an error, a parity-check signal P1 is asserted (i.e., asserted to "1" in this example). The parity-check signal P1 is sent out as a correctable error detection signal, and is also supplied to the selectors 71, the AND circuit 72, and the error memory circuit 73.

The parity-check circuit 63 determines whether there is an error by performing a parity check based on the data supplied from the data-purpose flip-flops 61 and the parity bit supplied from the parity-bit-purpose flip-flop 62. If there is an error, a parity-check signal P2 is asserted (i.e., asserted to "1" in this example). The parity-check signal P2 is supplied to the AND circuit 72 and the error memory circuit 74.

When there is no error in the data stored in the data-purpose flip-flops 51, the parity-check signal P1 output from the parity-check circuit 53 is "0". In this case, the selectors 71 select the data of the data-purpose flip-flops 51 for provision as output data Q0 through Q3.

When one of the data bits stored in the data-purpose flip-flops 51 is changed due to soft error, the parity-check circuit 53 detects a parity error, and changes the parity-check signal P1 to "1". In this case, the selectors 71 select the data of the data-purpose flip-flops 61 for provision as output data Q0 through Q3. Assuming that there is no error in the data-purpose flip-flops 61, the selecting operation of the selectors 71 as described above can correct the error. Further, the parity-check signal P1 being "1" is sent out as a correctable error detection signal, so that the correctable error detection signal is asserted.

When there is no error in the data stored in the data-purpose flip-flops 61, the parity-check signal P2 output from the parity-check circuit 63 is "0". In this case, the output of the AND circuit 72 is "0" regardless of the value of the parity-check signal P1. When there is no error in the data stored in the data-purpose flip-flops 51, the parity-check signal P1 output from the parity-check circuit 53 is "0". In this case, the output of the AND circuit 72 is "0" regardless of the value of the parity-check signal P2. When there is error in both the data stored in the data-purpose flip-flops 51 and the data stored in the data-purpose flip-flops 61, the parity-check signals P1 and P2 are both "1". In this case, the output of the AND circuit 72 is "1", asserting an uncorrectable error detection signal.

The flip-flop set shown in FIG. 6 supplies to an exterior an error-detection signal indicative of the presence/absence of parity error upon the determination regarding the presence/absence of parity error as described above. This error-detection signal corresponds to the error-detection signal shown in FIG. 1, and includes the correctable-error-detection signal indicating the presence of a correctable error and the uncorrectable-error-detection signal indicating the presence of an uncorrectable error. In this embodiment, two bits are provided as the error-detection-purpose flip-flops E. The error memory circuit 73 corresponds to an error in the data-purpose flip-flops 51, and the error memory circuit 74 corresponds to an error in the data-purpose flip-flops 61.

According to the third embodiment as described above, a flip-flop set in the semiconductor integrated circuit 10 is comprised of a first flip-flop set and a second flip-flop set provided in a duplicate fashion, each of which is provided with a parity-check function. When a parity error is detected, data of the flip-flop set that is not the flip-flop set suffering the parity error are output, thereby correcting an error upon the occurrence of parity error. In this manner, the reliability of flip-flop data in the semiconductor integrated circuit 10 can be improved.

Further, the present invention is not limited to these embodiments, but various variations and modifications may be made without departing from the scope of the present invention.

What is claimed is:

1. A semiconductor integrated circuit, comprising:
a plurality of flip-flop sets; and
a logic circuit configured to consolidate error-detection signals output from the flip-flop sets into one output signal,
wherein each of the flip-flop sets includes:
one or more flip-flops configured to latch input data in synchronization with a common clock signal; and
an error detection-&-correction circuit configured to detect and correct an error in data stored in the flip-flops, and to produce one of the error-detection signals indicative of the detection of the error upon the detection of the error.

2. The semiconductor integrated circuit as claimed in claim 1, wherein each of the flip-flop sets further includes an error-detection-purpose flip-flop configured to store a value indicative of the detection of the error upon the detection of the error by the error detection-&-correction circuit, and wherein error-detection-purpose flip-flops of the flip-flop sets are connected in series to form a chain, an end of which is led to an exterior of the semiconductor integrated circuit.

3. The semiconductor integrated circuit as claimed in claim 1, wherein the flip-flops of the flip-flop sets are connected in series to form a chain, an end of which is led to an exterior of the semiconductor integrated circuit.

4. The semiconductor integrated circuit as claimed in claim 1, wherein the output signal of the logic circuit is supplied to an exterior of the semiconductor integrated circuit.

5. The semiconductor integrated circuit as claimed in claim 1, further comprising a controller, wherein the output signal of the logic circuit is supplied to the controller.

6. The semiconductor integrated circuit as claimed in claim 1, wherein each of the flip-flop sets further includes:
an ECC generating circuit configured to generate an error correcting code from the input data;
one or more error-correcting-code-purpose flip-flops configured to store the error correcting code; and
an ECC-check-&-correction circuit configured to perform an error detection and an error correction based on the data stored in the one or more flip-flops and the error correcting code stored in the one or more error-correcting-code-purpose flip-flops.

7. The semiconductor integrated circuit as claimed in claim 1, wherein each of the one or more flip-flops of the flip-flop sets includes:
a plurality of latches configured to latch a common bit included in the input data; and
a majority-voting-logic circuit configured to compute a majority-voting-logic value with respect to outputs of the latches.

8. The semiconductor integrated circuit as claimed in claim 7, wherein each of the one or more flip-flops of the flip-flop sets further includes one or more delay elements configured to delay the clock signal to generate clock signals having respective, different timings, and wherein at least two of the latches latch a common bit included in the input data in synchronization with the clock signals having respective, different timings.

9. The semiconductor integrated circuit as claimed in claim 1, wherein the one or more flip-flops is a first group of one or more flip-flops, and each of the flip-flop sets further includes:
a parity generating circuit configured to generate a parity bit from the input data;
a parity-bit-purpose flip-flop configured to store the parity bit;
a second group of one or more flip-flops configured to latch the input data in synchronization with the clock signal;
a first parity-check circuit configured to perform a parity check with respect to the first group of one or more flip-flops based on the parity bit stored in the parity-bit-purpose flip-flop; and
a selector configured to select data stored in the first group of one or more flip-flops or data stored in the second group of one or more flip-flops in response to a result of the parity check performed by the first parity-check circuit.

* * * * *